United States Patent
Ibe et al.

(10) Patent No.: US 7,255,426 B2
(45) Date of Patent: Aug. 14, 2007

(54) SUBSTRATE FOR LIQUID DISCHARGE HEAD, LIQUID DISCHARGE HEAD USING SUBSTRATE FOR LIQUID DISCHARGE HEAD AND METHOD OF MANUFACTURING THE SAME

(75) Inventors: Satoshi Ibe, Yokohama (JP); Teruo Ozaki, Yokohama (JP); Yoshiyuki Imanaka, Kawasaki (JP); Takuya Hatsui, Setagaya-Ku (JP); Kenji Ono, Setagaya-Ku (JP); Ichiro Saito, Yokohama (JP); Sakai Yokoyama, Kawasaki (JP); Toshiyasu Sakai, Yokohama (JP); Kazuaki Shibata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 351 days.

(21) Appl. No.: 11/006,615

(22) Filed: Dec. 8, 2004

(65) Prior Publication Data
US 2005/0128254 A1    Jun. 16, 2005

(30) Foreign Application Priority Data

Dec. 16, 2003  (JP) ............................. 2003-417703
Nov. 26, 2004  (JP) ............................. 2004-342245

(51) Int. Cl.
*B41J 2/05*    (2006.01)
(52) U.S. Cl. ...................................... 347/58
(58) Field of Classification Search ................. 347/58, 347/59, 63, 62, 148; 257/753; 438/21
See application file for complete search history.

(56) References Cited

U.S. PATENT DOCUMENTS 5,648,806 A    7/1997  Steinfield et al. ............. 347/87
5,706,040 A    1/1998  Reid et al. ..................... 347/50
5,984,464 A    11/1999 Steinfield et al. ............. 347/87

(Continued)

FOREIGN PATENT DOCUMENTS

EP    0 707 967    4/1996

(Continued)

OTHER PUBLICATIONS

J. Lee, et al., "A Monolithic Thermal Inkjet Printhead Utilizing Electrochemical Etching and Two-Step Electroplating Techniques", IEEE Electron Devices Meeting, Washington DC, pp. 601-604 (1995).

(Continued)

*Primary Examiner*—Matthew Luu
*Assistant Examiner*—Lisa M Solomon
(74) *Attorney, Agent, or Firm*—Fitzpatrick, Cella, Harper & Scinto

(57) ABSTRACT

A number of steps is reduced by manufacturing an electrode pad connecting a liquid discharge head to an external wiring by the same step of a common wiring for supplying an electric power to a discharge energy generating portion. A number of manufacturing steps of a head is reduced by forming a substrate for a liquid discharge head having an electrode pad and a common wiring for supplying an electric power to a discharge energy as a metal film made of the same material as the electrode pad in accordance with a plating in a step of forming the common wiring of the metal film in accordance with a plating.

19 Claims, 7 Drawing Sheets

U.S. PATENT DOCUMENTS

| | | | |
|---|---|---|---|
| 6,155,674 A | 12/2000 | Figueredo et al. | 347/63 |
| 6,174,046 B1 | 1/2001 | Reid et al. | 347/50 |
| 6,290,334 B1 | 9/2001 | Ishinaga et al. | 347/59 |
| 6,332,677 B1 | 12/2001 | Steinfield et al. | 347/87 |
| 6,474,789 B1 | 11/2002 | Ishinaga et al. | 347/59 |
| 7,018,019 B2 * | 3/2006 | Kim | 347/62 |
| 2002/0005878 A1 | 1/2002 | Moon et al. | 347/58 |
| 2003/0179266 A1 | 9/2003 | Moon et al. | 347/62 |
| 2004/0017437 A1 | 1/2004 | Yamaguchi et al. | 347/64 |

FOREIGN PATENT DOCUMENTS

| | | |
|---|---|---|
| EP | 0 863 005 | 9/1998 |
| EP | 1 125 746 | 8/2001 |
| EP | 1 172 212 | 1/2002 |

OTHER PUBLICATIONS

J. Lee, et al., "Two-Dimensional Nozzle Arrangement in a Monolithic Thermal Inkjet Printhead for High-Resolution and High-Speed Printing", IEEE Electron Devices Meeting, Washington DC, pp. 127-130 (1999).

* cited by examiner

SUBSTRATE FOR LIQUID DISCHARGE HEAD, LIQUID DISCHARGE HEAD USING SUBSTRATE FOR LIQUID DISCHARGE HEAD AND METHOD OF MANUFACTURING THE SAME

BACKGROUND OF THE INVENTION

1. Field of the Invention

The present invention relates to a substrate for a liquid discharge head forming a liquid droplet by discharging a liquid such as an ink or the like, a liquid discharge head using the substrate for the liquid discharge head and a method of manufacturing the same.

2. Description of the Related Art

In conventional, a memory element substrate corresponding to a main portion of an ink jet head is structured, as shown in FIG. 18, such that an electric wiring, a member 523 constructing a liquid chamber filled with an ink, and the like are formed as a memory element substrate 501 on a substrate 502 in accordance with a film forming technique. As the substrate 502, for example, a Si substrate having a thickness of 0.5 to 1 mm is employed. A plurality of ink supply ports 503 constituted by long groove-shaped through ports are opened on the substrate 562 for receiving the liquid within the liquid chamber from the external portion. Electrothermal converting elements 504 are arranged at both side positions of the respective ink supply ports 503 on the substrate 502 in a zigzag manner every one line.

The liquid chamber is communicated with each of the ink supply ports 503, and is formed such as to internally pack the electrothermal converting elements 504 formed in both sides of each of the ink supply ports 503. An ink flow path wall 507 forming an ink flow path communicating with a position on each of the electrothermal converting elements 504 from the ink supply port 503 is formed within the liquid chamber, and a discharge port 508 is open to an upper side of each of the electrothermal converting elements 504. Further, an electric wiring (not shown) made of Al or the like and provided for supplying an electric power to each of the electrothermal converting elements 504 is formed on the substrate 502. The electric wiring is connected to an electrode portion 505 connected to an external electric power supply source. The electrode portion 505 is provided near both ends in a longitudinal direction on the substrate 502, and has a plurality of connection members 506 formed side by side, made of Au or the like and called as a bump.

Further, in accordance with a multicolor and a high quality picture of a recorded image as typified by a photo grade in recent years, it is intended to increase a number of nozzles (ink discharge ports) and make a nozzle density narrow in pitch, in the ink jet head. Accordingly, an increase in numbers and a narrower pitch are intended with respect to the electrothermal converting element formed on the memory element substrate. In addition, since a function of the electrothermal converting element is made high, an increase in numbers and a narrower pitch are intended with respect to the bump 506 provided on the electrode pad of the electrode portion 505.

Accordingly, there has been considered that the electric wiring for introducing the electric power supplied from the head outer portion to the electrothermal converting element is made thick in film on the substrate in view of necessity of intending to make a resistance low.

However, in the prior art mentioned above, in the case that forming the connection member 506 such as the bump or the like is executed on an upper layer of a head chip corresponding to the memory element substrate 501 in accordance with an independent step after forming the electric wiring which has been considered to be made thick at this time, a number of manufacturing steps of the ink jet head is increased in addition that a lot of time is required for forming the thickened electric wiring itself. Accordingly, there is a problem that a cost is increased.

SUMMARY OF THE INVENTION

The present invention is made by taking the unsolved problem in the prior art mentioned above into consideration, and an object of the present invention is to provide a substrate for a liquid discharge head which can contribute to a reduction in manufacturing cost by using a metal film made of the same material as a material used in the same film forming step as that of a common wiring of a drive circuit in a discharge energy generating portion, as an electrode pad for electrically connecting between a substrate having a discharge energy generating portion and an external wiring, a liquid discharge head using the substrate for the liquid discharge head, and a method of manufacturing the same.

The other object of the present invention is to provide a substrate for a liquid discharge head including an electric wiring constituted by a metal film formed in accordance with a plating method and provided for supplying an electric power to the discharge energy generating portion, and an electrode pad formed by the same metal material as the electric wiring in accordance with a plating method and receiving an electric power supplied to the electric wiring from an outer portion of the substrate for the liquid discharge head, as a substrate for a liquid discharge head for discharging a liquid on the basis of a discharge energy generated from a discharge energy generating portion.

DETAILED DESCRIPTION OF THE PREFERRED EMBODIMENTS

Figure 1:
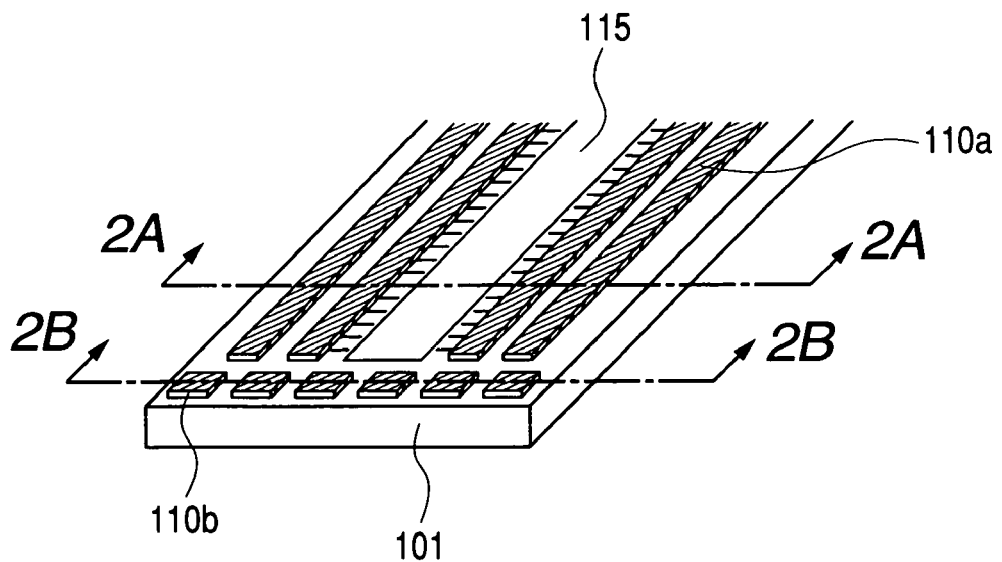
FIG. 1 is a schematic perspective view of a substrate for an ink jet recording head as an embodiment in accordance with the present invention.
Figure 2A:
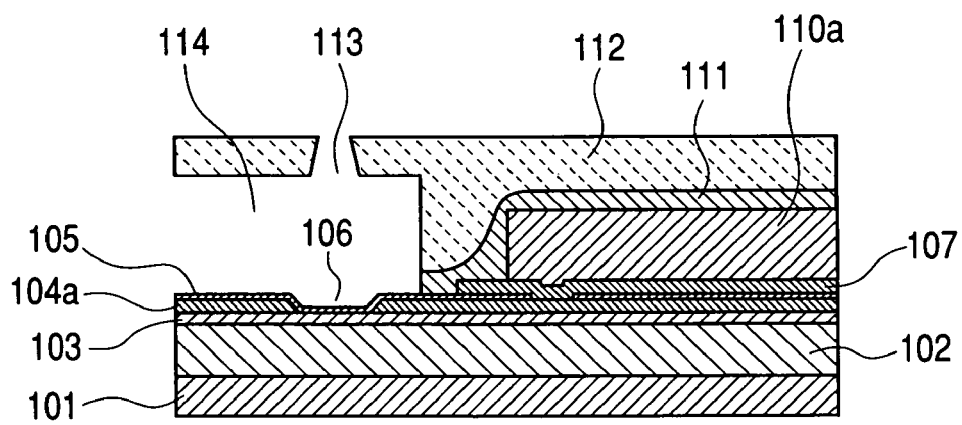
FIGS. 2A and 2B are schematic cross sectional views of the substrate for the ink jet recording head in FIG. 1.
Figure 2B:
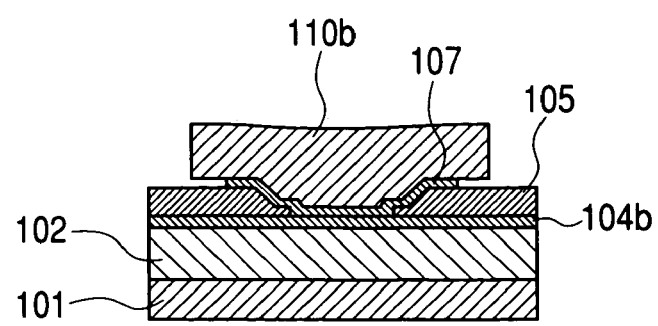

FIG. 1 is a schematic perspective view of a substrate for an ink jet recording head as an embodiment of a substrate for a liquid discharge head in accordance with the present invention. An ink supply port 115 and thick metal films 110a and 110b for supplying an electric power for driving a head are formed on a silicon substrate 101. FIG. 2A shows a cross section near an ink discharge port 113 in a cross section along a line 2A-2A in this drawing, and FIG. 2B shows a cross section near one electrode pad in a cross section along a line 2B-2B thereof.

In FIG. 2A, reference numeral 102 denotes a heat storage layer made of SiO$_2$ on the silicon substrate 101, reference numeral 103 denotes a heat generating resistance body layer, reference symbol 104a denotes an individual aluminum wiring, reference symbol 104b denotes an aluminum wiring for an electrode, reference numeral 106 denotes a heat generating portion serving as a discharge energy generating portion generating an energy for discharging an ink, reference symbol 110a denotes a common wiring formed by a thick metal film and supplying a drive electric power to the individual aluminum wiring 104a, reference numeral 107 denotes a close contact improving layer having both a performance of improving a close contact between the individual aluminum wiring 104a and the common wiring 110a and a corrosion resistance and made of a metal material having a high melting point, reference numeral 114 denotes an ink flow path, reference numeral 113 denotes an ink discharge port, reference numeral 112 denotes a flow path forming layer forming the ink flow path 114 and the ink discharge port 113, and reference numeral 111 denotes a resin layer intending to improve a closely contact between the common wiring 110a and the flow path forming layer 112 and to serve as an insulating film. Further, in FIG. 2B, reference numeral 110b denotes an electrode pad for supplying an electric power supplied from the external portion on the basis of an electric conducting with the common wiring 110a.

In this case, since the present embodiment is exemplified by a discharge head using an ink as a liquid discharged by a discharge head in the present invention, the ink discharge port corresponds to one embodiment of the liquid discharge port, and the ink flow path corresponds to one embodiment of the liquid flow path, for example.

In the present embodiment, a plurality of ink discharge ports 113 discharging the ink are provided in correspondence to the respective heat generating portions 106, and the common wiring 110a formed by the thick metal film on the substrate for the ink jet recording head is formed along an ink discharge port line formed by a plurality of ink discharge ports 113, and the ink supply port 115 communicating with each of the ink discharge ports 113. In this case, the common wiring 110a may be formed in parallel to the ink discharge port line or the ink supply port 115, or three elements may be formed in parallel to both of the ink discharge port line and the ink supply port 115. It is possible to improve a flatness of the nozzle material 112 applied to an upper layer of a post-drawn mold for forming the ink flow path 114 as mentioned below, by employing any one of the structures.

In accordance with an aspect of the substrate for the ink jet recording head on the basis of the present embodiment, in order to form the common wiring 110a formed by the thick metal film supplying a drive electric power to the individual aluminum wiring 104a of the heat generating portion 106, the gold (Au) is used as the close contact improving layer 107 having both of the close contact improving performance and the corrosion resistance and the metal material formed on the close contact improving layer. Further, the same metal material gold (Au) is used for forming the electrode pad 110b electrically connecting the common wiring 110a for supplying the drive electric power to the individual aluminum wiring 104a of the heat generating portion 106 to the external portion. Further, the close contact improving layer 107 formed on an uppermost layer of an inorganic metal layer of the silicon substrate 101 and arranged in a lower layer of the common wiring 110a is formed wider than a line width of the common wiring 110a formed by the thick-metal film.

At this time, the common wiring 110a and the electrode pad 110b are simultaneously formed by the same step in accordance with a plating method. Accordingly, in order to correspond to the request of making a resistance of the electric wiring lower due to a high integration of the structure on the substrate caused by an increase in numbers of the ink discharge ports, it is possible to simultaneously form the electrode pad while intending to make the film of the common wiring 110a thick. Accordingly, it is possible to intend to shorten the manufacturing step and reduce a cost.

Accordingly, a description will be given in detail of a manufacturing method using the plating method with respect to the formation of the common wiring 110a and the electrode pad 110b which supply the drive electric power to the individual aluminum wiring 104a of the heat generating portion 106 with reference to FIGS. 3A to 13.

Figure 3A:
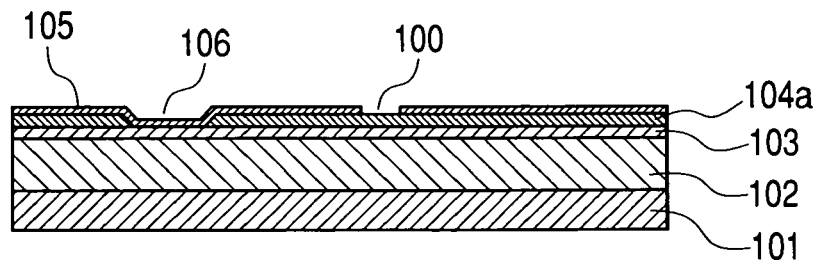
FIGS. 3A and 3B are schematic views explaining a step of manufacturing the substrate for the ink jet recording head in accordance with the present embodiment.
Figure 3B:
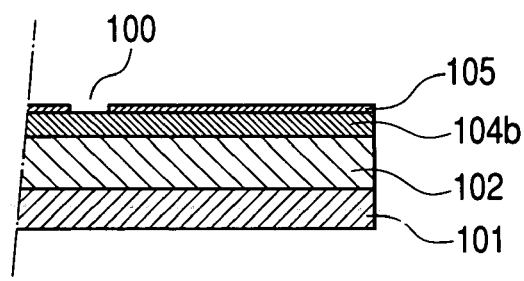

The method forms the heat storage layer 102 made of SiO$_2$, the heat generating resistance body layer 103, the individual aluminum wiring 104a, the electrode aluminum wiring 104b and the protection film 105 on the silicon substrate 101 in accordance with a vacuum film forming method or the like. Further, the method executes a patterning on the basis of a photolithography technique, and forms the through hole 100 for obtaining the electric conduction between the common wiring 110a and the individual aluminum wiring 104a, and between the electrode pad 110b and the electrode aluminum wiring 104b (FIGS. 3A and 3B). In this case, it is desirable that an interlayer insulation film such as SiO$_2$ or the like is formed between the individual aluminum wiring 104a and the electrode aluminum wiring 104b, and the protection film 105. Further, the heat generating resistance layer 103 is not laminated between the heat storage layer 102 existing in the lower side of the electrode pad 110b and the electrode aluminum wiring 104b (FIG. 3B). In this case, a lower side of an end portion (not shown) in an opposite side to the heat generating portion side end portion of the common wiring 110a has a region in which the individual aluminum wiring 104a is not formed, and the electrode aluminum wiring 104b and the common wiring 110a are electrically conducted there. Accordingly, the electric power supplied from the electrode pad 110b is converted into the heat at a position of the heat generating resistance layer 103 of the heat generating portion 106 through the electrode aluminum wiring 104b, the common wiring 110a and the individual aluminum wiring 104a.

Figure 4:
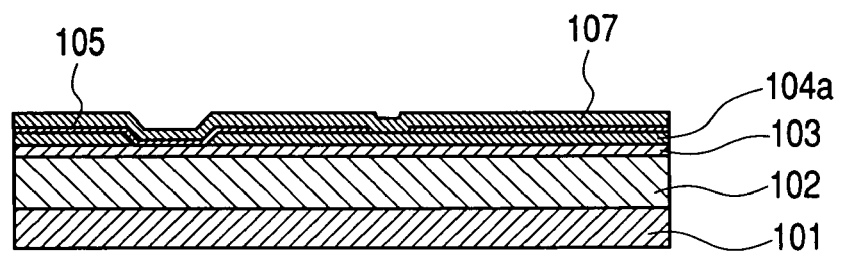
FIG. 4 is a schematic view explaining a step of manufacturing the substrate for the ink jet recording head in accordance with the present embodiment.

Next, the method forms the close contact improving layer (a barrier metal) 107, for example, TiW or the like as a metal material having a high melting point at a predetermined thickness on an entire surface in accordance with a vacuum film forming apparatus or the like (FIG. 4).

Figure 5:
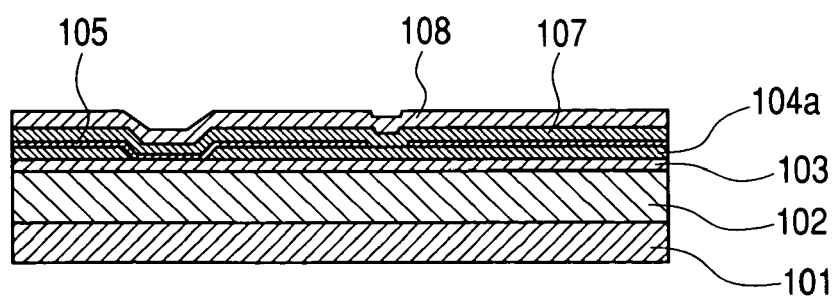
FIG. 5 is a schematic view explaining a step of manufacturing the substrate for the ink jet recording head in accordance with the present embodiment.

Next, the method forms the gold (Au) layer 108 which is excellent as the wiring metal at a predetermined thickness on an entire surface by the vacuum film forming apparatus or the like (FIG. 5).

Figure 6:
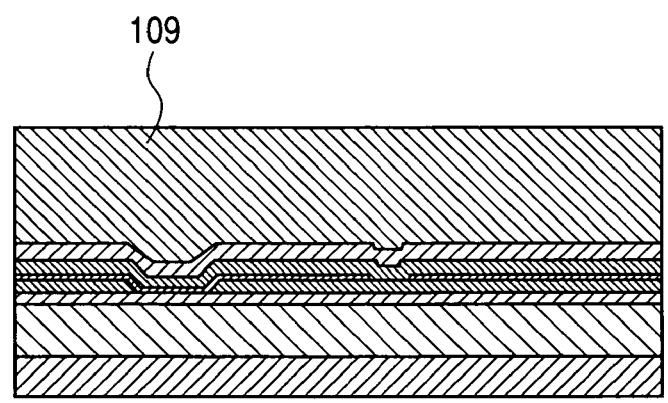
FIG. 6 is a schematic view explaining a step of manufacturing the substrate for the ink jet recording head in accordance with the present embodiment.

Thereafter, the method applies a positive type photo resist 109 on a surface of a plating electric conductor metal 108 in accordance with a spin coat method (FIG. 6). At this time, the method applies the photo resist 109 thick so as to be higher than a height of the common wiring 110a on the substrate.

Figure 7:
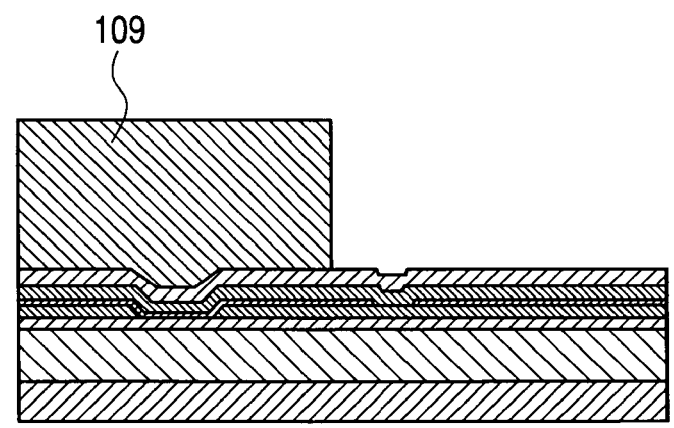
FIG. 7 is a schematic view explaining a step of manufacturing the substrate for the ink jet recording head in accordance with the present embodiment.

Next, the method executes a resist exposure and development in accordance with the photolithography method, and executes the formation of the resist forming the plating metal material, for the purpose of removing the photo resist 109 so as to expose the plating electric conductor metal 108 in the position at which the common wiring 110a and the electrode pad 110b are formed (FIG. 7).

Figure 8:
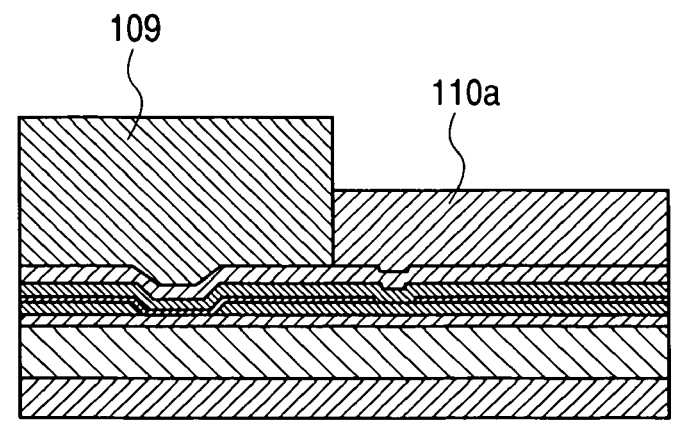
FIG. 8 is a schematic view explaining a step of manufacturing the substrate for the ink jet recording head in accordance with the present embodiment.

Thereafter, the method circulates a predetermined current to the plating electric conductor metal 108 in a gold salt sulfite electrolytic bath in accordance with an electrolytic plating method so as to precipitate the gold in a predetermined region which is not covered with the photo resist 109 (FIG. 8). Accordingly, the method simultaneously forms the common wiring 110a (FIG. 8) and the electrode pad 110b (not shown).

Figure 9A:
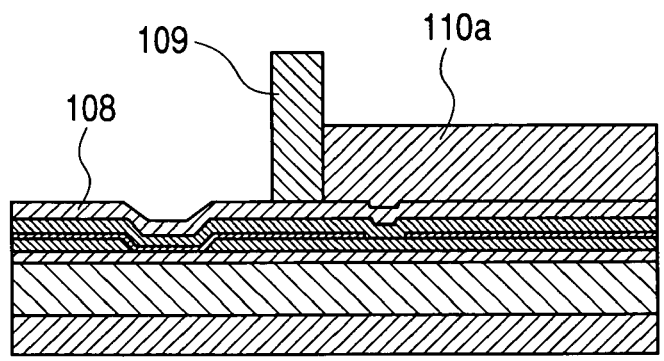
FIGS. 9A and 9B are schematic views explaining a step of manufacturing the substrate for the ink jet recording head in accordance with the present embodiment.
Figure 9B:
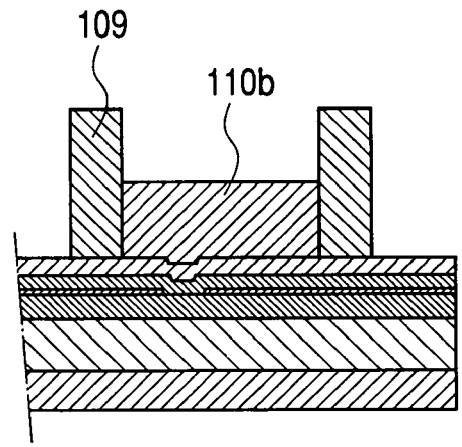

Next, the method applies the exposure and development only to a region which is intended to be left wider than the width of the common wiring 110a in the close contact improving layer 107 formed by the metal material having the high melting point in the lower layer of the common wiring 110a with respect to the positive type resist 109 forming the plating metal material in accordance with the photolithography method, thereby leaving only a predetermined region of the resist 109 forming the mask of the close contact improving layer 107 (FIG. 9A). At this time, the resist 109 used for forming the electrode pad 110b is removed (FIG. 9B).

Figure 10A:
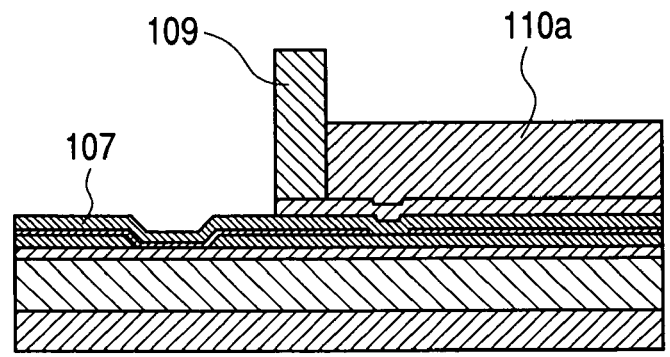
FIGS. 10A and 10B are schematic views explaining a step of manufacturing the substrate for the ink jet recording head in accordance with the present embodiment.
Figure 10B:
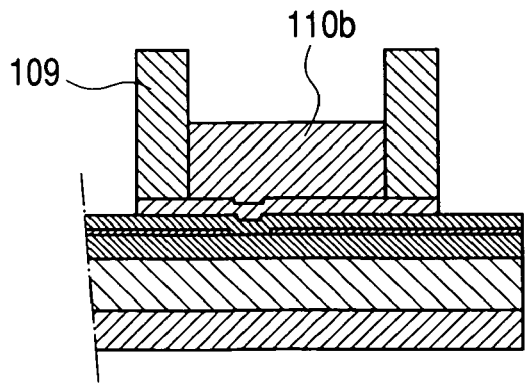

Next, the method etches and removes an outermost layer of the common wiring 110a, an outermost layer of the electrode pad 110b and the plating electric conductor metal 108 by dipping the plating electric conductor metal 108 in an etching reagent containing a nitrogen organic compound, an iodine and a potassium iodide for a predetermined time (FIGS. 10A and 10B). Accordingly, the method exposes the close contact improving layer (the barrier metal) 107 constituted by the metal material having the high melting point such as TiW or the like.

Figure 11:
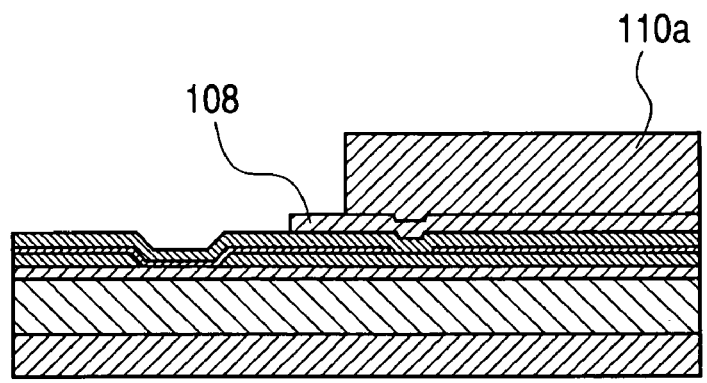
FIG. 11 is a schematic view explaining a step of manufacturing the substrate for the ink jet recording head in accordance with the present embodiment.

Next, the method removes the photo resist 109 by dipping in a peeling solution of the photo resist 109 for a predetermined time, and exposes the plating electric conductor metal 108 only in the region which is intended to be left wider than the width of the common wiring 110a, in the close contact improving film 107 in the lower layer of the common wiring 110a (FIG. 11).

Figure 12:
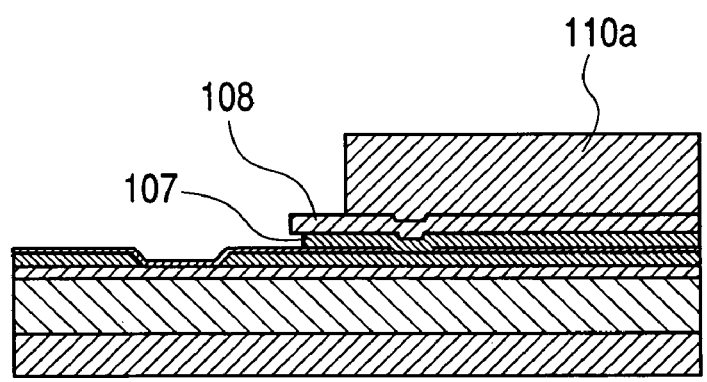
FIG. 12 is a schematic view explaining a step of manufacturing the substrate for the ink jet recording head in accordance with the present embodiment.

Thereafter, the method removes the exposed metal material having the high melting point by setting a part of the plating electric conductor metal 108 running over from the lower end of the common wiring 110a to a mask, and dipping the close contact improving film (the barrier metal) 107 made of the metal material having the high melting point such as TiW or the like in an $H_2O_2$ etching reagent (FIG. 12). At this time, an end portion of the close contact improving film 107 is etched over the gold layer 108 existing thereon, and the close contact improving layer 107 is left in a step shown in FIG. 11 such that the portion is not positioned in the lower side of the common wiring 110a. At this time, the close contact improving layer 107 existing in the periphery of the lower end of the electrode pad 110b is also removed. At this time, a part of the close contact improving layer 107 positioned at the lower end of the electrode pad 110b is over-etched (refer to FIG. 2B), however, since an entire of an electric connection portion including the electrode pad 110b is completely covered with a sealing resin in the later step, a quality of the product is not affected, and it is possible to make a pitch interval of the electrode pad 110b small.

Figure 13:
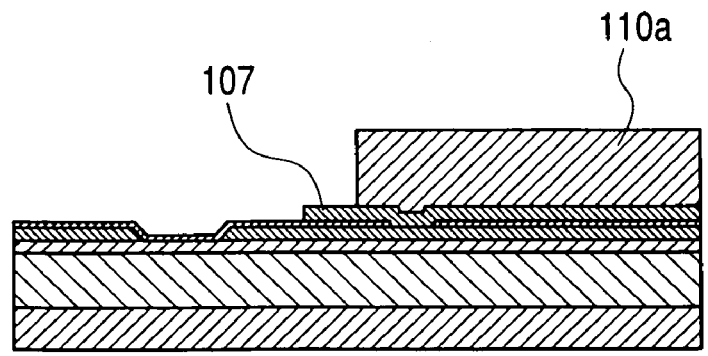
FIG. 13 is a schematic view explaining a step of manufacturing the substrate for the ink jet recording head in accordance with the present embodiment.

Next, it is possible to leave the close contact improving layer 107 in the lower layer of the common wiring 110a wider than the width of the common wiring 110a, by dipping and removing the position of the plating electric conductor metal 108 which is used as the unnecessary mask in the etching reagent containing the nitrogen organic compound, the iodine and the potassium iodide for a predetermined time (FIG. 13). At this time, the outer layer of the common wiring 110a and the electrode pad 110b formed by the gold (Au) is dissolved to some extent, however, this matter does not generate a problem in manufacturing.

Figure 14:
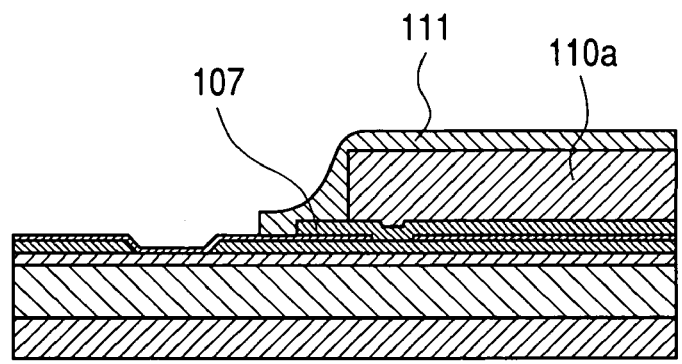
FIG. 14 is a schematic view explaining a step of manufacturing the substrate for the ink jet recording head in accordance with the present embodiment.

Thereafter, the method intends to improve the closely contact between the common wiring 110a and the flow path forming layer 112, and applies a resin, for example, a polyether amide resin forming the resin layer 111 doubling as the insulating layer at an optional thickness in accordance with a spin coat method (FIG. 14).

Thereafter, the method applies a material for forming the flow path forming layer 112 onto the resin layer 111 at an optional thickness from the above of the posterior drawn metal material corresponding to the ink flow path 114 in accordance with the spin coat method, executes the exposure and development in accordance with the photolithography method, and forms a plurality of discharge ports 113 for discharging the ink, and the ink flow path 114 communicating with the discharge ports 113, whereby it is possible to obtain the substrate for the ink jet recording head as shown in FIGS. 1 and 2.

As mentioned above, in the case of the conventional structure in which the close contact improving film 107 is formed so as to prevent the width from being wider than the line width of the common wiring 110a, there is a risk that a bubble pool is generated due to a space caused by the over-etching of the close contact improving film 107 in the lower end of the common wiring 110a, however, since the close contact improving film 107 made of the metal material having the high melting point is formed in the lower layer of the thick metal film formed as the common wiring 110a so as to have the width wider than the line width of the common wiring 110a, as in the present embodiment, no bubble pool is generated in the lower layer of the common wiring 110a even by applying the resin layer 111 doubling as the insulating film on the outer layer of the common wiring 110a. Accordingly, it is possible to intend to improve a reliability with respect to the problem of the peeling of the flow path forming layer 112 forming the ink flow path 114 communicating with the discharge port 113.

In this case, a step shown in FIG. 7 executes the exposure and development of the resist in accordance with the photolithography method, and forms the resist forming the plating mold material by removing the photo resist 109 in the position forming the common wiring 110a, however, in accordance with the conventional plating technique, a cross sectional shape of the photo resist film in the middle of the plating process is formed in a trapezoidal shape which is slightly expanded toward the lower end. Accordingly, the cross sectional shape of the formed common wiring 110a is frequently formed in an inverted trapezoidal shape such as to slightly protrude toward an upper side like a visor. Therefore, the material forming the flow path forming layer 112 can not sufficiently fill up a space formed by a visor-like lower portion of the common wiring 110a and the upper portion of the plating electric conductor metal 108, and there is a risk that the ink flow path 114 and the common wiring 110a are defectively separated.

An embodiment for previously and securely preventing the disadvantage from being generated will be shown as follows.

Figure 15:
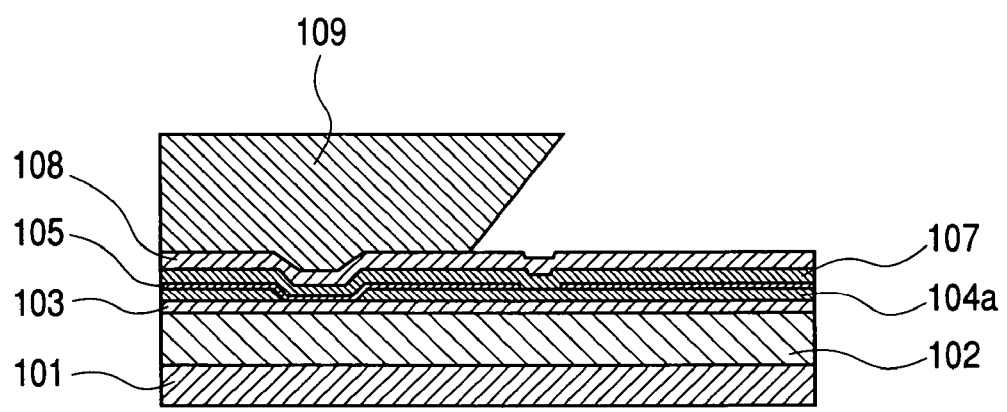
FIG. 15 is a schematic view explaining a step of manufacturing the substrate for the ink jet recording head as the other embodiment in accordance with the present invention.

The cross sectional shape of the developed photo resist 109 is formed as a visor-like end-portion having a slope surface covering the silicon substrate 101 in accordance with moving apart from the silicon substrate 101, by progressively adjusting a focus condition and a developing condition of the exposure apparatus along the film thickness direction of the photo resist 109, in a step corresponding to FIG. 7 (FIG. 15).

Figure 16:
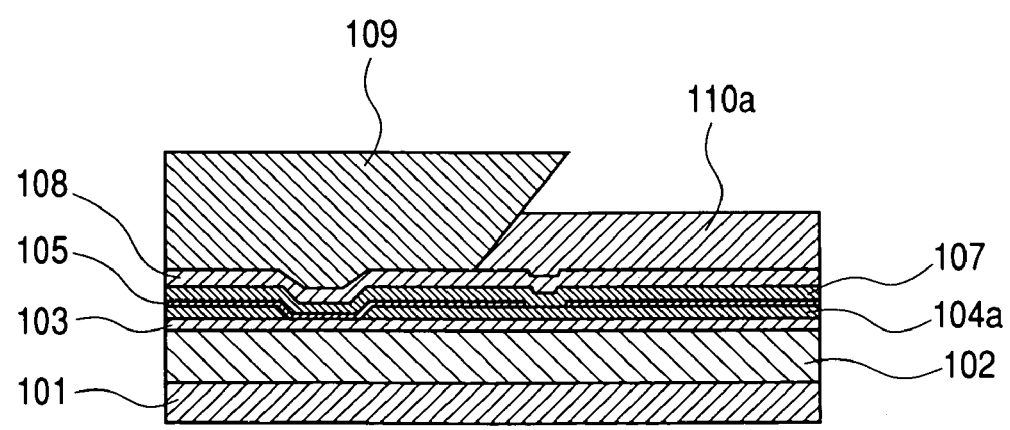
FIG. 16 is a schematic view explaining a step of manufacturing the substrate for the ink jet recording head in accordance with the other embodiment.

Thereafter, the common wiring 110a with the trapezoidal cross section having the slope surface expending toward the lower side (the silicon substrate side) is obtained by forming the thick metal film made of the gold (Au) in accordance with the plating method, in the step corresponding to FIG. 8 mentioned above (FIG. 16).

Figure 17:
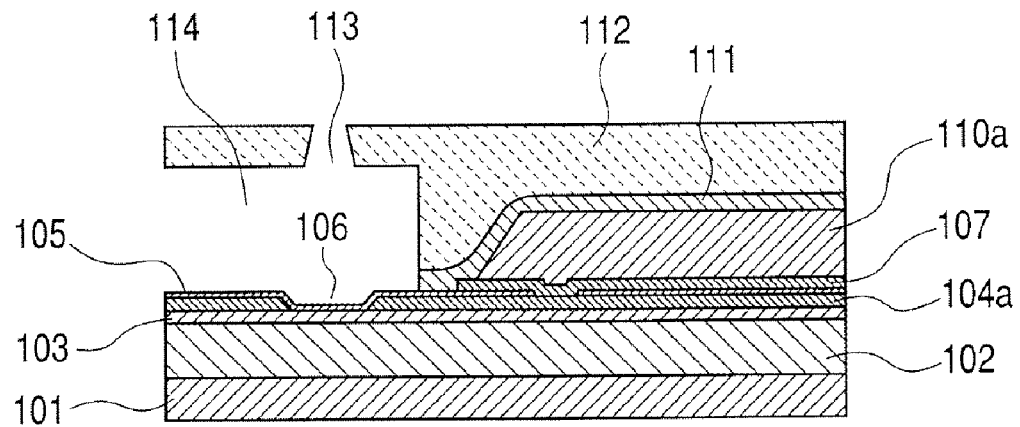
FIG. 17 is a schematic cross sectional view explaining a substrate for an ink jet recording head in accordance with the other embodiment.
Figure 18:
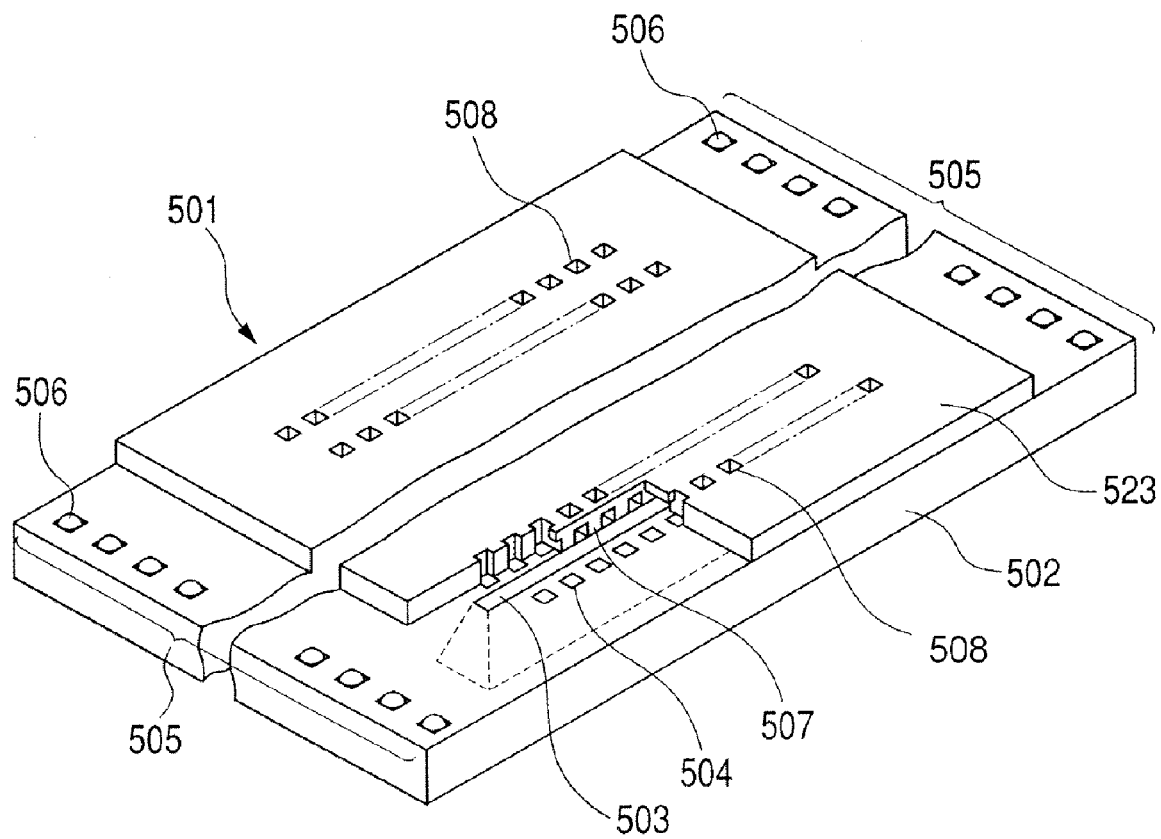
FIG. 18 is a schematic perspective view of a conventional substrate for an ink jet recording head.

Further, the head substrate having the cross sectional shape as shown in FIG. 17 can be obtained by passing through the steps corresponding to the respective steps shown in FIGS. 9 to 14 mentioned above. In accordance with this structure, it is possible to form the resin layer 111 along the slope surface in the end portion of the downward expending common wiring 110a so as to generate no gap with respect to the common wiring 110a, and it is possible to more securely prevent the disadvantage mentioned above from being generated. In other words, even in the case that the resin layer 111 for improving the closely contact performance between the flow path forming layer 112 and the common wiring 110a gets over the end portion of the common wiring 110a formed by the thick metal film, it is possible to obtain a stable coverage performance. Further, a plurality of discharge ports 113 for discharging the ink and the ink flow path 114 communicating with the discharge ports 113 are formed by applying the material for forming the flow path forming layer 112 onto the resin layer 111 at the optional thickness in accordance with the spin coat method, and executing the exposure and development in accordance with the photolithography method, however, at this time, it is possible to form the outermost surface of the flow path forming layer 112 existing between the ink flow path 114 and the common wiring 110a flatter, on the basis of the upward slope in the end portion of the common wiring 110a.

This application claims priority from Japanese Patent Application Nos. 2003-417703 filed Dec. 16, 2003 and 2004-342245 filed Nov. 26, 2004, which are hereby incorporated by reference herein.

What is claimed is:

1. A substrate for a liquid discharge head discharging a liquid from a liquid discharge port on the basis of a discharge energy generated from a discharge energy generating portion comprising:
   an electric wiring for supplying an electric power to said discharge energy generating portion, said electric wiring being a metal film formed in accordance with a plating method; and
   an electrode pad receiving the electric power supplied to said electric wiring from an outer portion of said substrate for the liquid discharge head, said electrode pad being formed by using the same metal material as said electric wiring in accordance with a plating method;
   wherein a close contact improving layer is formed in a lower layer of said electrode pad, and a width of said electrode pad is narrower than a line width of said electric wiring.

2. The substrate for a liquid discharge head according to claim 1, wherein said electrode pad is formed in accordance with the plating at a time of forming said electric wiring in accordance with the plating.

3. The substrate for a liquid discharge head according to claim 1, wherein said electric wiring is provided along a liquid discharge port line formed by a plurality of said liquid discharge ports.

4. The substrate for a liquid discharge head according to claim 1, wherein said electric wiring is provided along a liquid supply port supplying to said liquid discharge port.

5. The substrate for a liquid discharge head according to claim 1, wherein a cross sectional shape of said electric wiring is formed in a trapezoidal shape having a downward expanding slope.

6. The substrate for a liquid discharge head according to claim 5, wherein the substrate is provided with a flow path forming layer for forming said liquid discharge port and a liquid flow path guiding the liquid to said liquid discharge port through a resin layer covering an upper side of said electric wiring.

7. A liquid discharge head discharging a liquid from a liquid discharge port on the basis of a discharge energy generated from a discharge energy generating portion comprising:
   an electric wiring for supplying an electric power to said discharge energy generating portion, said electric wiring being a metal film formed in accordance with a plating method;
   an electrode pad receiving the electric power supplied to said electric wiring from an outer portion of a substrate for the liquid discharge head, said electrode pad being formed by using the same metal material as said electric wiring in accordance with a plating method; and
   a flow path forming layer provided through a resin layer covering an upper side of said electric wiring, and forming said liquid discharge port and a liquid flow path guiding the liquid to said liquid discharge port;

wherein a close contact improving layer is formed in a lower layer of said electrode pad, and a width of said electrode pad is narrower than a line width of said electric wiring.

8. The liquid discharge head according to claim 7, wherein said electrode pad is formed in accordance with the plating at a time of forming said electric wiring in accordance with the plating.

9. The liquid discharge head according to claim 7, wherein said electric wiring is provided along a liquid discharge port line formed by a plurality of said liquid discharge ports.

10. The liquid discharge head according to claim 7, wherein said electric wiring is provided along a liquid supply port supplying to said liquid discharge port.

11. The liquid discharge head according to claim 7, wherein a cross sectional shape of said electric wiring is formed in a trapezoidal shape having a downward expanding slope.

12. A method of manufacturing a substrate for a liquid discharge head discharging a liquid from a liquid discharge port on the basis of a discharge energy generated from a discharge energy generating portion comprising the steps of:
   a step of forming a metal film serving as an electric wiring for supplying an electric power to said discharge energy generating portion in accordance with a plating method; and
   a step of forming an electrode pad receiving the electric power supplied to said electric wiring from an outer portion of said substrate for the liquid discharge head by using the same metal material as said electric wiring in accordance with a plating method;
   wherein a close contact improving layer is formed in a lower layer of said electrode pad, and a width of said electrode pad is narrower than a line width of said electric wiring.

13. The method of manufacturing a substrate for a liquid discharge head according to claim 12, wherein said electrode pad is formed by the same step as the step of forming said electric wiring in accordance with the plating.

14. The method of manufacturing a substrate for a liquid discharge head according to claim 12, wherein a step of forming a close contact improving layer in a lower layer of said electric wiring is provided before the step of forming said electric wiring, and a step of leaving a width of said close contact improving layer wider than a line width of said electric wiring is provided after the step of forming said electric wiring.

15. The method of manufacturing a substrate for a liquid discharge head according to claim 12, wherein a step of forming a close contact improving layer in a lower layer of said electrode pad is provided before the step of forming said electrode pad, and a step of leaving a width of said close contact improving layer narrower than a line width of said electrode is provided after the step of forming said electrode pad.

16. The method of manufacturing a substrate for a liquid discharge head according to claim 12, wherein said electric wiring is formed along a liquid discharge port line formed by a plurality of said liquid discharge ports.

17. The method of manufacturing a substrate for a liquid discharge head according to claim 12, wherein said electric wiring is formed along a liquid supply port supplying to said liquid discharge port.

18. The method of manufacturing a substrate for a liquid discharge head according to claim 12, wherein a cross sectional shape of said electric wiring is formed in a trapezoidal shape having a downward expanding slope.

19. The method of manufacturing a substrate for a liquid discharge head according to claim 18, wherein a step of forming a resin layer covering an upper side of said electric wiring and a step of forming a flow path forming layer for forming said liquid discharge port and a liquid flow path guiding the liquid to said liquid discharge port through said resin layer are provided after the step of forming said electric wiring.

* * * * *